US012763738B2

(12) United States Patent
Kuo

(10) Patent No.: US 12,763,738 B2
(45) Date of Patent: Oct. 13, 2026

(54) CLASS-D AMPLIFIER

(71) Applicant: RICHTEK TECHNOLOGY CORP., Hsinchu County (TW)

(72) Inventor: Yao-Chun Kuo, New Taipei City (TW)

(73) Assignee: RICHTEK TECHNOLOGY CORP., Hsinchu County (TW)

( * ) Notice: Subject to any disclaimer, the term of this patent is extended or adjusted under 35 U.S.C. 154(b) by 309 days.

(21) Appl. No.: 18/765,324

(22) Filed: Jul. 7, 2024

(65) Prior Publication Data

US 2026/0012146 A1 Jan. 8, 2026

(51) Int. Cl.
*H03F 3/217* (2006.01)
*H03F 3/45* (2006.01)

(52) U.S. Cl.
CPC ......... *H03F 3/217* (2013.01); *H03F 3/45479* (2013.01); *H03F 2200/165* (2013.01)

(58) Field of Classification Search
CPC .................................. H03F 3/217; H03F 3/38
See application file for complete search history.

(56) References Cited

U.S. PATENT DOCUMENTS 7,986,187 B1 7/2011 Nussbaum
10,749,488 B2 8/2020 Quilter
2011/0068870 A1* 3/2011 Chao .................. H03F 3/45475 330/251
2016/0218703 A1 7/2016 Nielsen
2021/0119589 A1 4/2021 Wen
2021/0265959 A1* 8/2021 Lee ........................ H03G 3/348
2022/0045655 A1* 2/2022 Huang ...................... H03F 1/30

FOREIGN PATENT DOCUMENTS

CN 111885462 A 11/2020
CN 115603551 A 1/2023

OTHER PUBLICATIONS

Clifton ,"Pre-Filter Parallel Bridge-Tied Load (PBTL)," Texas Instruments, Sep. 2018.

* cited by examiner

*Primary Examiner* — Henry Choe
(74) *Attorney, Agent, or Firm* — Winston Hsu

(57) ABSTRACT

A class-D amplifier includes a loop filter, a PWM generator coupled to the loop filter, a first multiplexer coupled to the PWM generator, a second multiplexer coupled to the PWM generator, and a power stage coupled to the first multiplexer and the second multiplexer. The loop filter is used to generate positive and negative LPF signals according to first and second analog signals, and first and a second feedback signals. The PWM generator is used to generate positive and negative PWM signals according to the positive and negative LPF signals respectively. The first and second multiplexer are used to output first and second MUX signals selected from a signal group. The power stage is used to generate a positive output signal to a positive output terminal according to the first MUX signal, and a negative output signal to a negative output terminal according to the second MUX signal.

20 Claims, 8 Drawing Sheets

CLASS-D AMPLIFIER

BACKGROUND OF THE INVENTION

1. Field of the Invention

The present disclosure relates to electronic circuits, with specific emphasis on amplifier circuit configurations and architectures.

2. Description of the Prior Art

Class-D amplifiers (CDAs) represent a paradigm shift in amplification technology, diverging significantly from conventional amplifier designs. Unlike traditional amplifiers that utilize transistors as linear gain elements, CDAs employ transistors as high-speed electronic switches. The amplification process in CDAs is achieved through an innovative technique known as pulse-width modulation (PWM). In a Class-D amplifier, the input audio signal undergoes a transformation into a series of pulses, where the width of each pulse corresponds to the instantaneous amplitude of the audio waveform. These pulses then drive the output transistors, causing them to switch rapidly between fully on and fully off states. This switching action generates a high-frequency reconstruction of the original audio signal. Subsequently, a loop filter is applied to eliminate the high-frequency artifacts introduced by the switching process, yielding a clean, amplified audio output.

The principal advantage of class-D amplification lies in its exceptional efficiency. As the transistors operate primarily in either saturation or cut-off modes, power dissipation in the form of heat is minimized. This efficiency translates to several benefits, including reduced thermal output, enhanced battery longevity in portable devices, and the potential for more compact amplifier designs due to diminished heat dissipation requirements. The high efficiency and performance characteristics of class-D amplifiers have led to their widespread adoption across a diverse range of applications. From miniature audio systems in smartphones to high-power home theater installations, CDAs have become a preferred choice for audio amplification, offering an optimal balance of power efficiency and sound quality.

To achieve higher output power and efficiency in Class-D amplifiers, a technique known as Parallel Bridge-Tied Load (PBTL) can be implemented. The PBTL configuration represents a sophisticated approach to amplifier design, specifically engineered to address the challenges of driving low impedance loads while maintaining high power output and efficiency. This configuration ingeniously combines the principles of parallel amplification with the bridge-tied load topology, resulting in a system that excels in high-current applications.

At its core, a PBTL amplifier typically comprises two identical amplifier units or integrated circuits. These units are first connected in parallel, which effectively doubles the current-handling capacity of the system. This parallel arrangement is then bridged, creating a configuration that can deliver substantial power into low impedance loads. The bridging aspect of the design allows for increased voltage swing across the load, while the parallel connection ensures that the current demand is shared between the two amplifier units.

This unique configuration offers several advantages, particularly in scenarios where traditional amplifier designs might struggle. PBTL amplifiers excel in driving loads with very low impedance, which are frequently encountered in car audio systems and marine audio applications. By distributing the current demand and heat generation across two amplifier units, PBTL designs can achieve higher power output while maintaining better thermal management compared to single-ended or standard bridge-tied load configurations.

However, it's important to note that the benefits of PBTL amplifiers come at the cost of increased complexity in design and implementation. Engineers must carefully consider factors such as component matching, signal routing, and phase alignment to ensure optimal performance. Despite these challenges, the PBTL configuration remains a popular choice in applications where high power output into low impedance loads is a critical requirement, offering a solution that balances power delivery, efficiency, and reliability.

Conventional class-D amplifier integrated circuits employing PBTL configurations have traditionally relied on dual identical output power stages to meet increased current-driving requirements. This approach involves parallel connection of output channels to reduce internal resistance, thereby enabling higher current delivery to the load. However, this conventional method necessitates significant additional circuitry both on-chip and externally, increasing complexity and cost. Moreover, as power output demands rise, the implementation of PBTL configurations often leads to escalated heat dissipation requirements, presenting substantial thermal management challenges. These limitations in current PBTL designs have created a need for more efficient and thermally optimized solutions in high-performance class-D amplifier systems, particularly for applications demanding high power output and enhanced current-driving capabilities.

SUMMARY OF THE INVENTION

An embodiment provides a class-D amplifier comprising a loop filter (LPF), a pulse-width modulation (PWM) generator coupled to the loop filter, a first multiplexer (MUX) coupled to the PWM generator, a second multiplexer coupled to the PWM generator, and a power stage coupled to the first multiplexer and the second multiplexer. The loop filter is used to generate a positive LPF signal and a negative LPF signal according to a first analog signal, a second analog signal, a first feedback signal and a second feedback signal. The PWM generator is used to generate a first positive PWM signal and a first negative PWM signal according to the positive LPF signal and the negative LPF signal respectively. The first multiplexer is used to output a first MUX signal selected from a signal group comprising the first positive PWM signal and the first negative PWM signal. The second multiplexer is used to output a second MUX signal selected from the signal group. The power stage is used to generate a positive output signal to a positive output terminal according to the first MUX signal, and a negative output signal to a negative output terminal according to the second MUX signal.

An embodiment provides an amplifier comprising a master chip and a slave chip. The master chip comprises a loop filter (LPF), a pulse-width modulation (PWM) generator coupled to the loop filter, a first multiplexer (MUX) coupled to the PWM generator, a second multiplexer coupled to the PWM generator, and a power stage coupled to the first multiplexer and the second multiplexer. The loop filter is used to generate a positive LPF signal and a negative LPF signal according to a first analog signal, a second analog signal, a first feedback signal and a second feedback signal. The PWM generator is used to generate a positive PWM signal and a negative PWM signal according to the positive LPF signal and the negative LPF signal respectively. The first multiplexer is used to output a first MUX signal selected from a signal group comprising the positive PWM signal and the negative PWM signal. The second multiplexer is used to output a second MUX signal selected from the signal group. The power stage is used to generate a positive output signal to a positive output terminal according to the first MUX signal, and a negative output signal to a negative output terminal according to the second MUX signal. The slave chip comprises a loop filter, a PWM generator coupled to the loop filter, a first multiplexer coupled to the PWM generator of the master chip and the PWM generator of the slave chip, a second multiplexer coupled to the PWM generators of the master chip and the slave chip, a power stage coupled to the first multiplexer and the second multiplexer of the slave chip. The first multiplexer in the slave chip is used to output a first MUX signal selected from the signal group. The second multiplexer in the slave chip is used to output a second MUX signal selected from the signal group. The power stage in the slave chip is used to generate a positive output signal to a positive output terminal according to the first MUX signal output by the first MUX of the slave chip, and a negative output signal to a negative output terminal according to the second MUX signal output by the second MUX of the slave chip. The master chip and the slave chip form a parallel bridge-tied load (PBTL) configuration.

These and other objectives of the present invention will no doubt become obvious to those of ordinary skill in the art after reading the following detailed description of the preferred embodiment that is illustrated in the various figures and drawings.

DETAILED DESCRIPTION

The present disclosure provides a detailed description of various embodiments. While specific implementation details are presented herein to facilitate a comprehensive understanding of the disclosure, it will be apparent to those skilled in the art that the present invention may be realized without necessarily adhering to all such particularities. In certain instances, well-established methods, procedures, components, and circuits have been omitted from exhaustive description to avoid unnecessarily obfuscating the present disclosure. It should be understood that technical features individually described in relation to a single drawing may be implemented either discretely or in combination with other features, as set forth in the present specification.

Figure 1A:
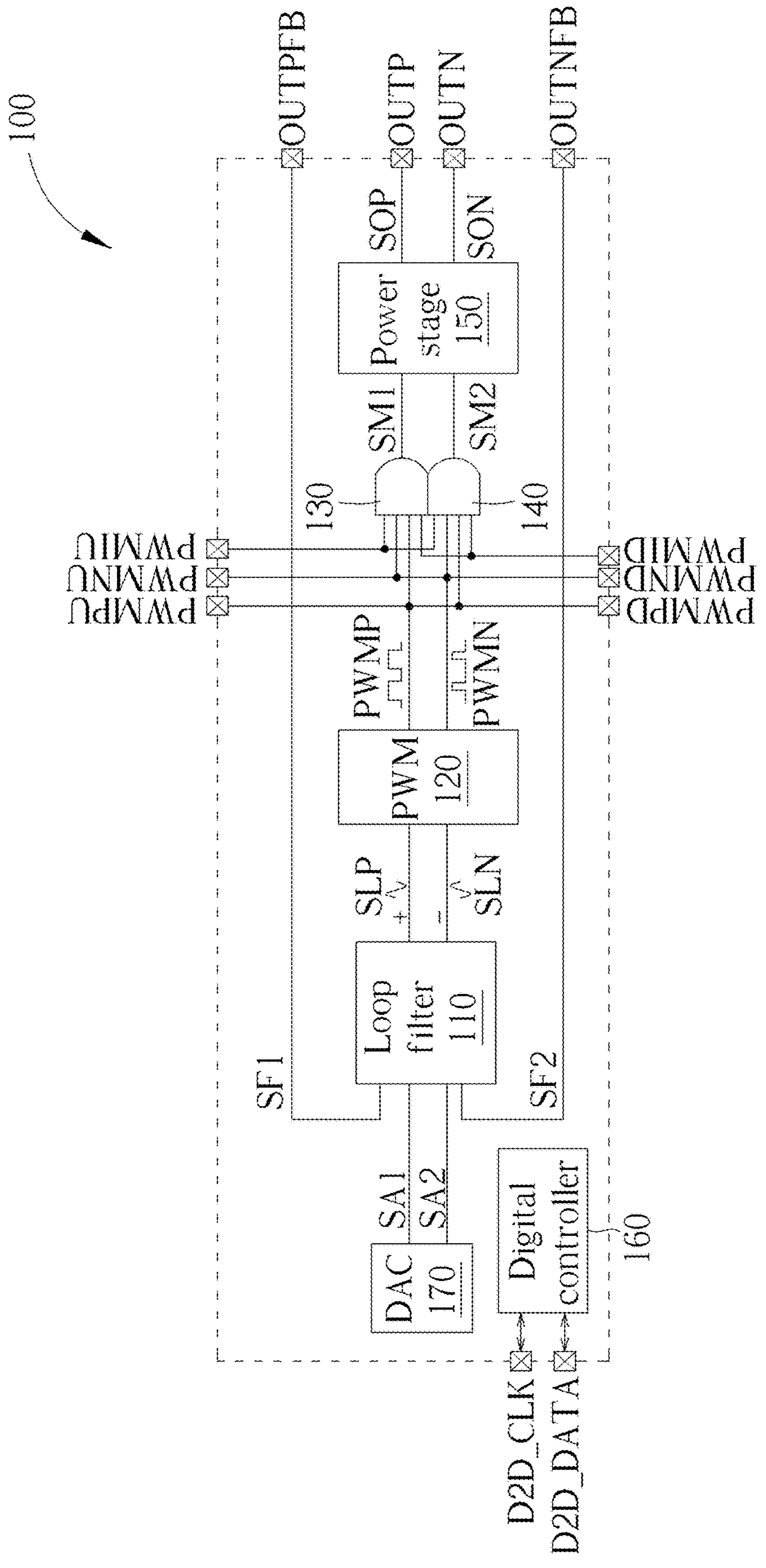
FIG. 1A depicts a class-D amplifier according to an embodiment.

FIG. 1A depicts a class-D amplifier 100 according to an embodiment. The class-D amplifier 100 includes several key components: a loop filter 110, a pulse-width modulation (PWM) generator 120, a first multiplexer (MUX) 130, a second multiplexer 140, and a power stage 150. These components work together to process input signals and generate the amplified output signals.

The loop filter 110 receives input signals, a first analog signal SA1, a second analog signal SA2, a first feedback signal SF1 and a second feedback signal SF2. It then generates output signals, a positive LPF signal SLP and a negative LPF signal SLN, based on the input signals SA1 and SA2. These LPF signals SLP and SLN are fed into the PWM generator 120.

The PWM generator 120 takes the positive LPF signal SLP and the negative LPF signal SLN as inputs and generates a first positive PWM signal PWMP and a first negative PWM signal PWMN, respectively. These PWM signals PWMP and PWMN are then sent to the first multiplexer 130 and the second multiplexer 140.

The first multiplexer 130 and the second multiplexer 140 are both coupled to the PWM generator 120. They each select a signal from a group that includes the first positive PWM signal PWMP and the first negative PWM signal PWMN. The first multiplexer 130 outputs the selected signal as the first MUX signal SM1, while the second multiplexer 140 outputs the selected signal as the second MUX signal SM2.

In some embodiments, the signal group can further include a second positive PWM signal, a second negative PWM signal, a third positive PWM signal, and/or a third negative PWM signal. All of which can come from external circuits.

The power stage 150 receives the first MUX signal SM1 and the second MUX signal SM2. It uses these signals to generate a positive output signal SOP, which is sent to a positive output terminal, and a negative output signal SON, which is sent to a negative output terminal. These output signals represent the amplified versions of the input signals, processed through the various stages of the class-D amplifier 100.

In certain embodiments, the loop filter 110 can also generate the positive LPF signal SLP and the negative LPF signal SLN according to the first analog signal SA1, the second analog signal SA2, a first feedback signal SF1 and a second feedback signal SF2.

In certain embodiments, the class-D amplifier 100 can further include a digital-to-analog converter (DAC) 170 coupled to the loop filter 110. The DAC 170 can convert digital input signals to the first analog signal SA1 and the second analog signal SA2.

The class-D amplifier 100 may incorporate a digital controller 160 in some embodiments. The digital controller 160 is responsible for synchronizing the timing of various components within the amplifier 100 and processing the incoming digital signals, ensuring proper operation and coordination between the different elements of the system.

Figure 1B:
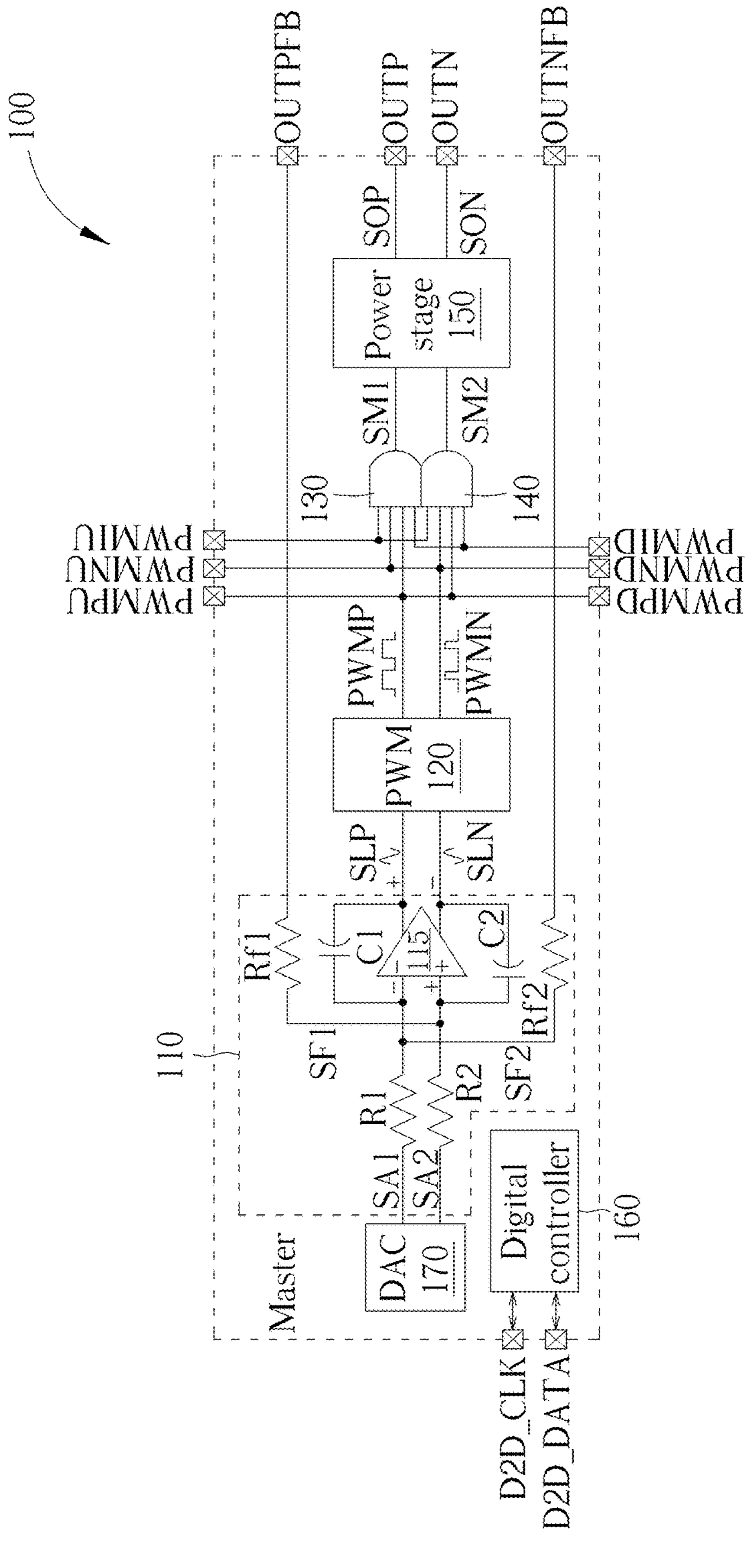
FIG. 1B depicts the class-D amplifier with an exemplary implementation of the loop filter of FIG. 1A.

FIG. 1B depicts the class-D amplifier 100 with an exemplary implementation of the loop filter 110. In this embodiment, the loop filter 110 may include an integrator. In this embodiment, the integrator can include a fully-differential amplifier 115 with specific input and output terminals, along with resistors connected to these terminals. The fully-differential amplifier 115 has a negative input terminal that receives the first analog signal SA1 and the second feedback signal SF2. It also has a positive input terminal that receives the second analog signal SA2 and the first feedback signal SF1. The positive output terminal of fully-differential amplifier 115 is coupled to the PWM generator 120 and outputs the positive LPF signal SLP, while the negative output terminal is also coupled to the PWM generator 120 and outputs the negative LPF signal SLN. A first resistor R1 is coupled to the negative input terminal of the fully-differential amplifier 115, and a second resistor R2 is coupled to the positive input terminal. Additionally, a first feedback resistor Rf1 is coupled to the positive input terminal of the fully-differential amplifier 115, and a second feedback resistor Rf2 is coupled to the negative input terminal of the fully-differential amplifier 115.

The class-D amplifier 100 can be built in a chip with pins, e.g., OUTPFB and OUTNFB, OUTP and OUTN. In more detail, pins PWMPU and PWMNU are responsible for positive and negative PWM outputs to the upper-side direction. Apin PWMIU is responsible for the external PWM input source from the upper-side direction. Pins PWMPD and PWMND are responsible for positive and negative PWM outputs to the down-side direction. A pin PWMID is responsible for external PWM input source from the down-side direction.

This architecture allows for flexible configuration of the class-D amplifier 100. In a single-chip configuration, the PWM signals can be generated internally and sent directly to the power stage 150, with pins OUTPFB and OUTNFB connected to pins OUTP and OUTN, respectively. The external PWM and synchronization pins are disabled in this mode.

On the other hand, in a cross-chip parallel bridge-tied load (PBTL) configuration, two substantially identical chips, each containing a class-D amplifier 100, are interconnected. One chip assumes the role of the master, while the other functions as the slave. The master chip generates the PWM signals, which is shared with the slave chip through the PWM pins (e.g., PWMPU, PWMNU, PWMPD, PWMND). The output pins (e.g., OUTP, OUTN) of both chips are connected to form the complete PBTL power stage, and the pins D2D_CLK and D2D_DATA enable synchronization and communication between the chips. The following paragraphs will provide a more detailed explanation of the PBTL configuration and its operation.

Figure 2:
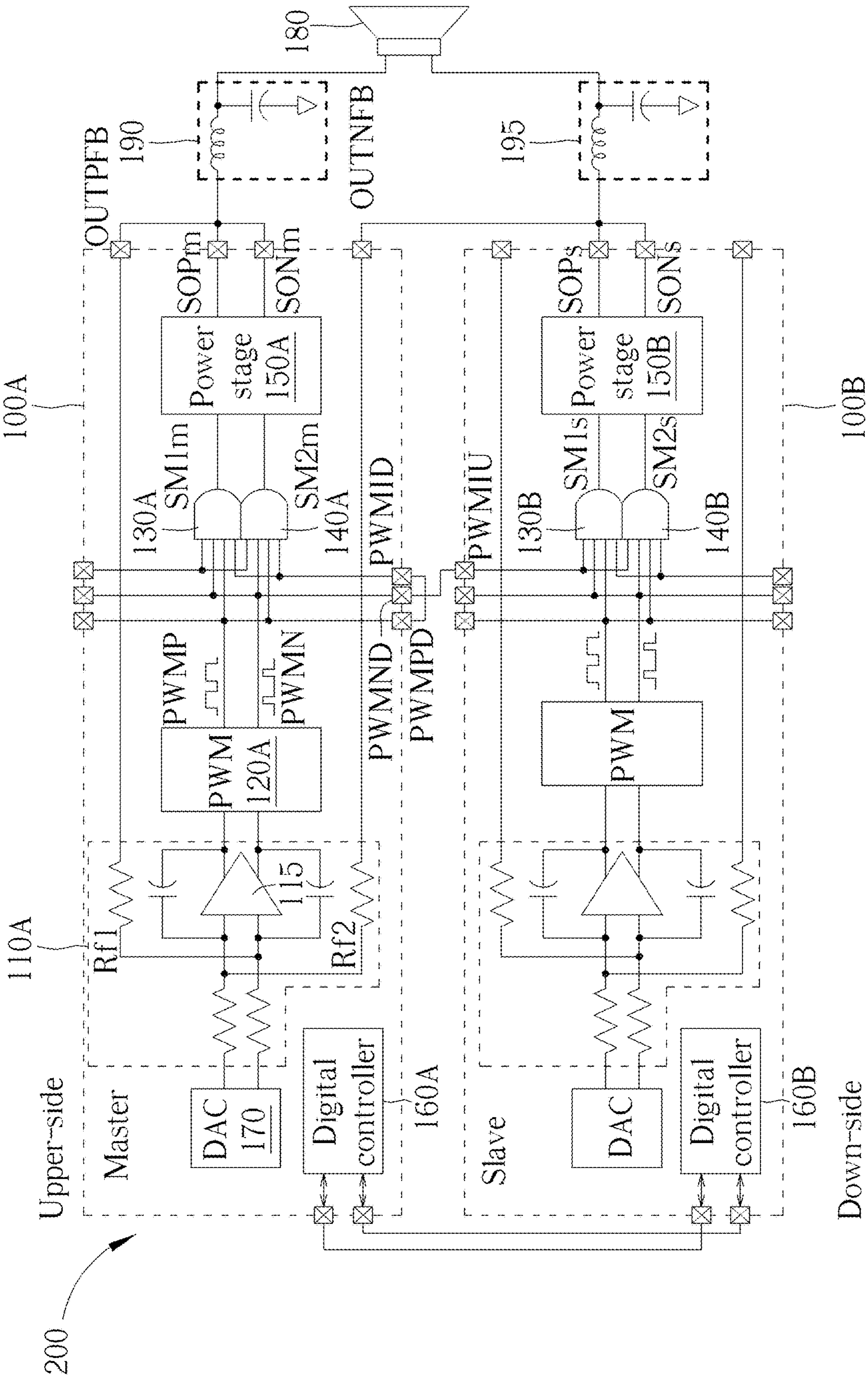
FIG. 2 depicts an amplifier with a PTBL configuration according to an embodiment.

FIG. 2 depicts an amplifier 200 with a parallel bridge-tied load (PTBL) configuration according to an embodiment. The amplifier 200 comprises two structurally identical chips, a master chip 100A and a slave chip 100B, both of which contain the class-D amplifier 100. The master chip 100A is positioned on the upper-side of the slave chip 100B, and they are interconnected to form the PBTL configuration.

A speaker 180 is coupled to two inductor-capacitor (LC) circuits, i.e., LC circuit 190 and LC circuit 195. The LC circuit 190 is coupled to the positive and negative output terminals of the power stage 150A within the master chip 100A. It is also coupled to the feedback resistor Rf1 of the loop filter 110A (via OUTPFB) in the master chip 100A. Similarly, the LC circuit 195 is coupled to the positive and negative output terminals of the power stage 150B within the slave chip 100B, and the feedback resistor Rf2 of the loop filter 110A (via OUTNFB) in the master chip 100A.

To facilitate digital signal and timing synchronization between the master and slave chips, the digital controller 160A of the master chip 100A and the digital controller 160B of the slave chip 100B are interconnected via pins D2D_CLK and D2D_DATA.

In the PBTL configuration described in this embodiment, the master chip 100A is responsible for generating both a positive PWM signal PWMP and a negative PWM signal PWMN with the PWM generator 120A. The positive PWM signal PWMP is routed through the pins PWMPD and PWMID to the multiplexers 130A and 140A within the master chip. These multiplexers 130A and 140A output the MUX signals SM1*m* and SM2*m*, which are then fed into the power stage 150A. The power stage 150A utilizes these signals to generate a positive output signal SOPm and a negative output signal SONm, which are used to drive the speaker 180. To remove switching noise and smooth the output waveforms of the positive output signal SOPm and the negative output signal SONm, the LC circuit 190 is employed.

The slave chip 100B, on the other hand, receives only the negative PWM signal PWMN from the master chip 100A. This signal is transmitted via the pin PWMND of the master chip 100A and the pin PWMIU of the slave chip 100B. Once received, the negative PWM signal PWMN is input to the multiplexers 130B and 140B within the slave chip 100B. Similar to the master chip 100A, the power stage 150B in the slave chip 100B receives the MUX signals SM1*s* and SM2*s* from the multiplexers 130B, 140B and uses them to generate a positive output signal SOPs and a negative output signal SONs. These output signals are also used to drive the speaker 180. The LC circuit 195, identical in function to the LC circuit 190 coupled to the master chip 100A, is used to smooth the output waveform of the SOPs and SONs signals and remove any switching noise.

Figure 3:
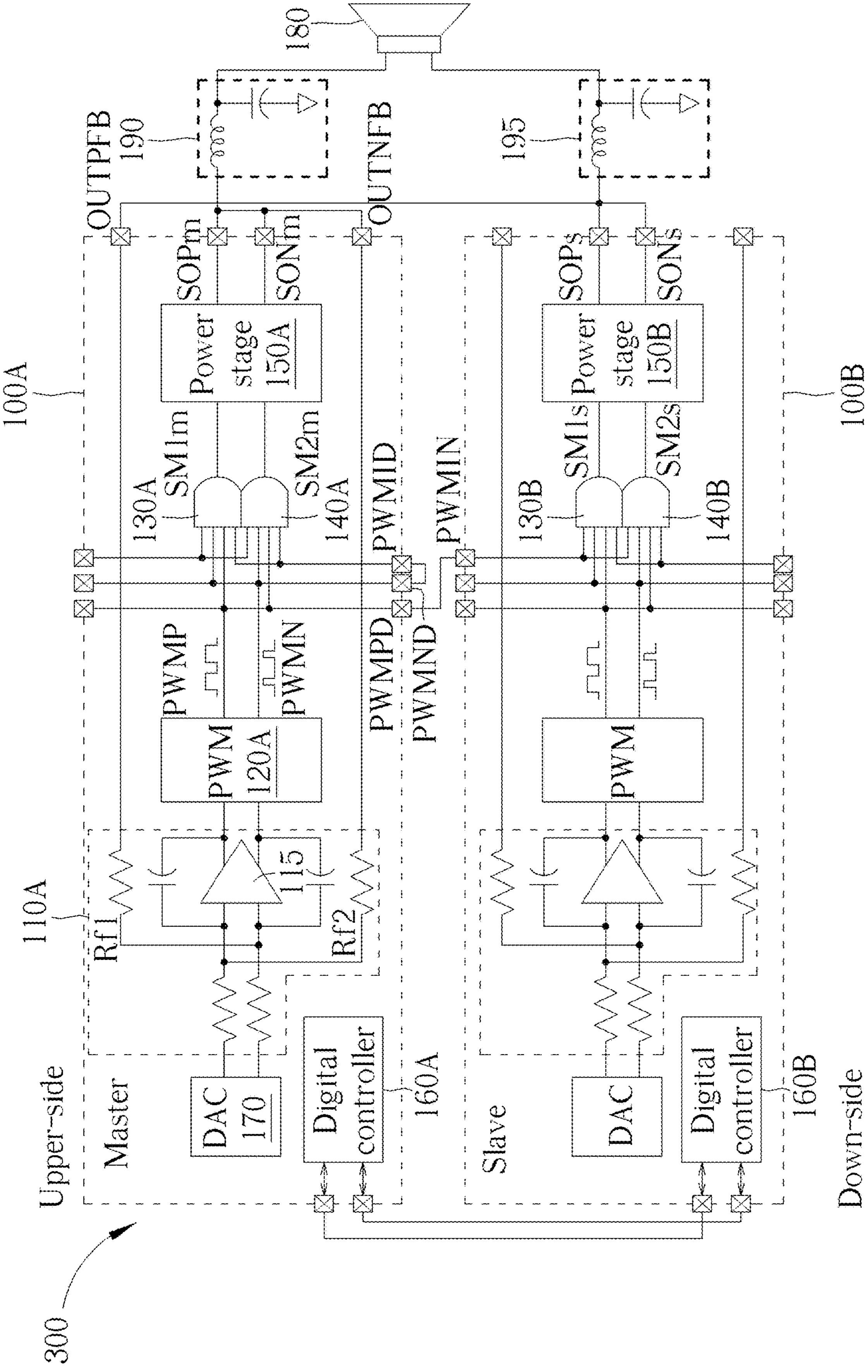
FIG. 3 depicts an amplifier with a PTBL configuration according to another embodiment.

FIG. 3 depicts an amplifier 300 with a PTBL configuration according to an embodiment. Similar to the amplifier 200, the amplifier 300 comprises two substantially identical chips, a master chip 100A and a slave chip 100B, both of which contain the class-D amplifier 100. The master chip 100A is positioned on the upper-side of the slave chip 100B, and they are interconnected to form the PBTL configuration.

A speaker 180 is coupled to two inductor-capacitor (LC) circuits, i.e., LC circuit 190 and LC circuit 195. The LC circuit 190 is coupled to the positive and negative output terminals of the power stage 150A within the master chip 100A. It is also coupled to the feedback resistor Rf2 of the loop filter 110A (via OUTNFB) in the master chip 100A. Similarly, the LC circuit 195 is coupled to the positive and negative output terminals of the power stage 150B within the slave chip 100B, and the feedback resistor Rf1 of the loop filter 110A (via OUTPFB) in the master chip 100A.

To facilitate digital signal and timing synchronization between the master and slave chips, the digital controller 160A of the master chip 100A and the digital controller 160B of the slave chip 100B are interconnected via pins D2D_CLK and D2D_DATA.

In the PBTL configuration described in this embodiment, the master chip 100A is responsible for generating both a positive PWM signal PWMP and a negative PWM signal PWMN with the PWM generator 120A. The negative PWM signal PNMN is routed through the PWMND and PWMID pins to the multiplexers 130A and 140A within the master chip 100A. These multiplexers 130A and 140A output the MUX signals SM1*m* and SM2*m*, which are then fed into the power stage 150A. The power stage 150A utilizes these signals to generate a positive output signal SOPm and a negative output signal SONm, which are used to drive the speaker 180. To remove switching noise and smooth the output waveforms of the positive output signal SOPm and negative output signal SONm, the LC circuit 190 is employed.

The slave chip 100B, on the other hand, receives only the positive PWM signal PWMP from the master chip 100A. This signal is transmitted via the pin PWMPD of the master chip 100A and the pin PWMIU of the slave chip 100B. Once received, the positive PWM signal PWMP is input to the multiplexers 130B and 140B within the slave chip 100B. Similar to the master chip 100A, the power stage 150B in the slave chip 100B receives the MUX signals SM1*s* and SM2*s* from the multiplexers 130B and 140B and uses them to generate a positive output signal SOPs and a negative output signal SONs. These output signals are also used to drive the speaker 180. The LC circuit 195, identical in function to the LC circuit 190 coupled to the master chip 100A, is used to smooth the output waveforms of the positive output signal SOPs and the negative output signal SONs and remove any switching noise.

Figure 4:
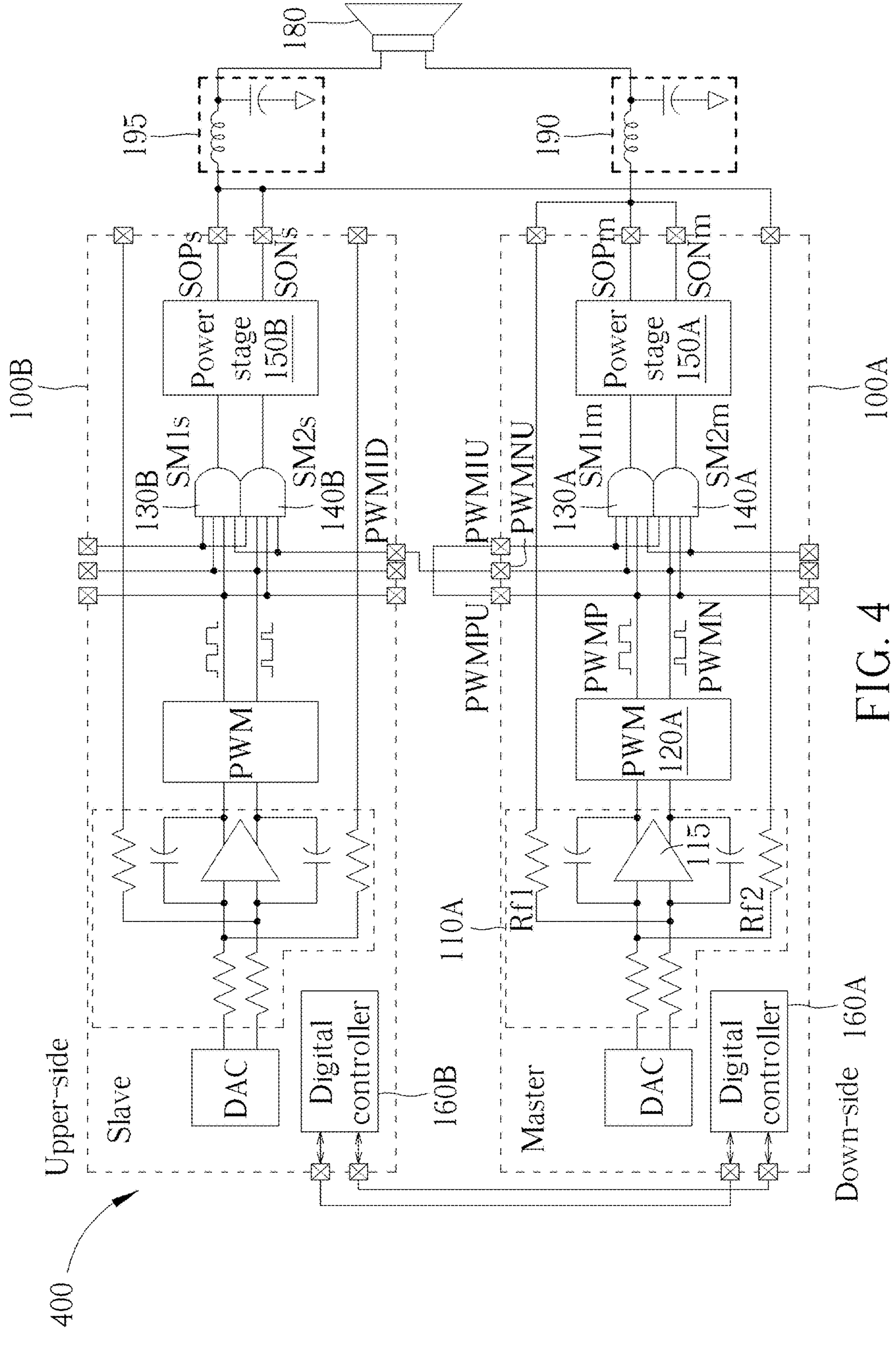
FIG. 4 depicts an amplifier with a PTBL configuration according to another embodiment.

FIG. 4 depicts an amplifier 400 with a PTBL configuration according to an embodiment. Similar to the amplifier 200, the amplifier 400 comprises two substantially identical chips, a master chip 100A and a slave chip 100B, both of which contain the class-D amplifier 100. In this embodiment, however, the master chip 100A is positioned on the down-side of the slave chip 100B, and they are also interconnected to form the PBTL configuration.

A speaker 180 is coupled to two inductor-capacitor (LC) circuits, i.e., LC circuit 190 and LC circuit 195. The LC circuit 190 is coupled to the positive and negative output terminals of the power stage 150A within the master chip 100A. It is also coupled to the feedback resistor Rf1 of the loop filter 110A (via OUTPFB) in the master chip 100A. Similarly, the LC circuit 195 is coupled to the positive and negative output terminals of the power stage 150B within the slave chip 100B, and the feedback resistor Rf2 of the loop filter 110A (via OUTNFB) in the master chip 100A.

To facilitate digital signal and timing synchronization between the master chip 100A and the slave chip 100B, the digital controller 160A of the master chip 100A and the digital controller 160B of the slave chip 100B are interconnected via pins D2D_CLK and D2D_DATA.

In the PBTL configuration described in this embodiment, the master chip 100A is responsible for generating both a positive PWM signal PWMP and a negative PWM signal PWMN with the PWM generator 120A. The positive PWM signal PWMP is routed through the pins PWMPU and PWMIU to the multiplexers 130A and 140A within the master chip 100A. These multiplexers 130A and 140A output the MUX signals SM1*m* and SM2*m*, which are then fed into the power stage 150A. The power stage 150A utilizes these signals to generate a positive output signal SOPm and a negative output signal SONm, which are used to drive the speaker 180. To remove switching noise and smooth the output waveforms of the positive output signal SOPm and the negative output signal SONm, the LC circuit 190 is employed.

The slave chip 100B, on the other hand, receives only the negative PWM signal PWMN from the master chip 100A. The negative PWM signal PWMN is transmitted via the pin PWMNU of the master chip 100A and the pin PWMID of the slave chip 100B. Once received, the negative PWM signal PWMN is input to the multiplexers 130B and 140B within the slave chip 100B. Similar to the master chip 100A, the power stage 150B in the slave chip 100B receives the MUX signals SM1*s* and SM2*s* from the multiplexers and uses them to generate a positive output signal SOPs and a negative output signal SONs. These output signals are also used to drive the speaker 180. The LC circuit 195, identical in function to the LC circuit 190 coupled to the master chip 100A, is used to smooth the output waveforms of the positive output signal SOPs and the negative output signal SONs and remove any switching noise.

Figure 5:
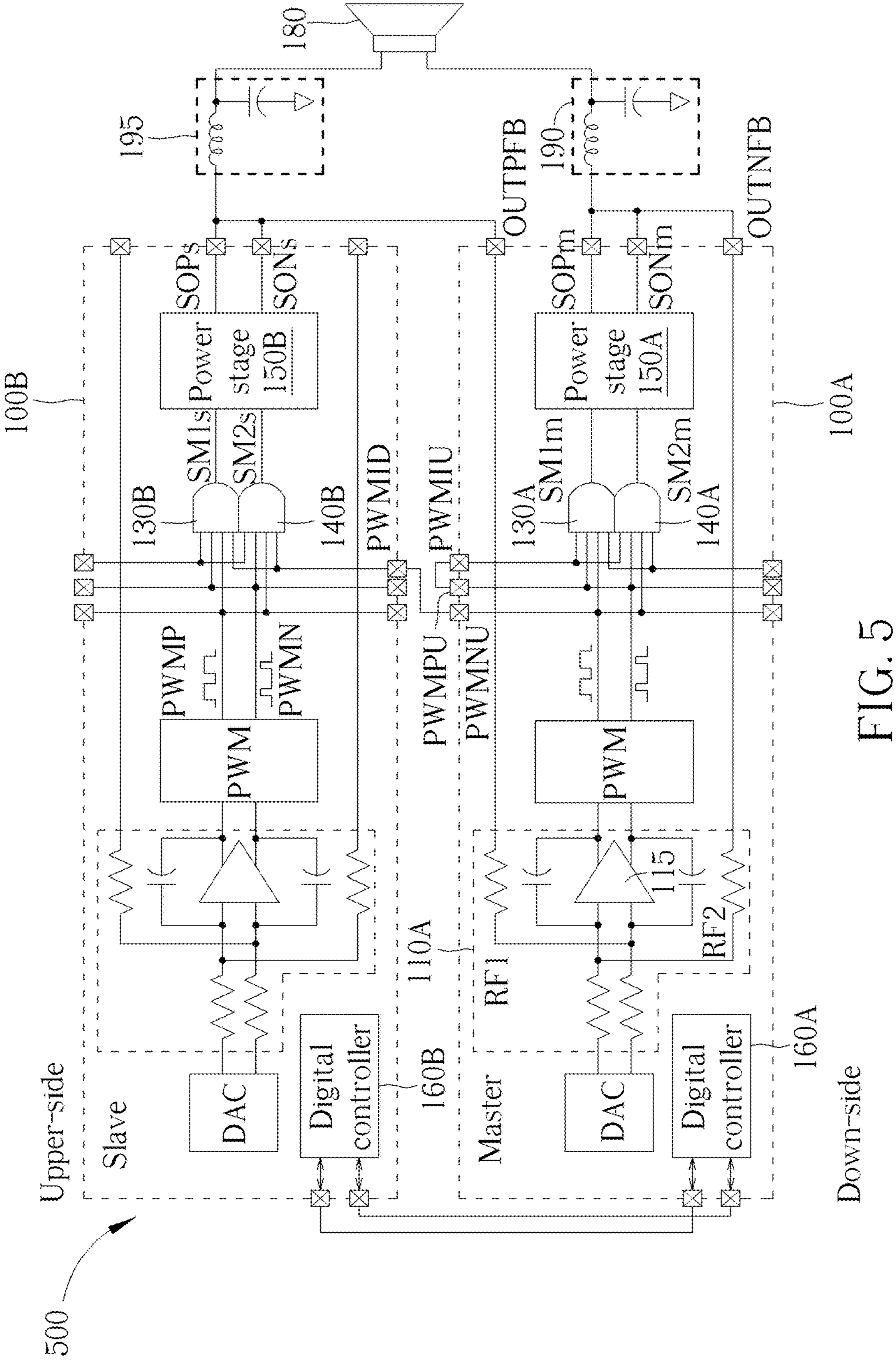
FIG. 5 depicts an amplifier with a PTBL configuration according to another embodiment.

FIG. 5 depicts an amplifier 500 with a PTBL configuration according to an embodiment. Similar to the amplifier 400, the amplifier 500 comprises two substantially identical chips, a master chip 100A and a slave chip 100B, both of which contain the class-D amplifier 100. The master chip 100A is positioned on the down-side of the slave chip 100B, and they are also interconnected to form the PBTL configuration.

A speaker 180 is coupled to two inductor-capacitor (LC) circuits, i.e., LC circuit 190 and LC circuit 195. The LC circuit 190 is coupled to the positive and negative output terminals of the power stage 150A within the master chip 100A. It is also coupled to the feedback resistor Rf2 of the loop filter 110A (via OUTNFB) in the master chip 100A. Similarly, the LC circuit 195 is coupled to the positive and negative output terminals of the power stage 150B within the slave chip 100B, and the feedback resistor Rf1 of the loop filter 110A (via OUTNFB) in the master chip 100A.

To facilitate digital signal and timing synchronization between the master and slave chips, the digital controller 160A of the master chip 100A and the digital controller 160B of the slave chip 100B are interconnected via pins D2D_CLK and D2D_DATA.

In the PBTL configuration described in this embodiment, the master chip 100A is responsible for generating both a positive PWM signal PWMP and a negative PWM signal PWMN with the PWM generator 120A. The negative PWM signal PWMN is routed through the pins PWMPU and PWMIU to the multiplexers 130A and 140A within the master chip 100A. These multiplexers 130A and 140A output the MUX signals SM1*m* and SM2*m*, which are then fed into the power stage 150A. The power stage 150A utilizes these signals to generate a positive output signal SOPm and a negative output signal SONm, which are used to drive the speaker 180. To remove switching noise and smooth the output waveforms of the positive output signal SOPm and the negative output signal SONm, the LC circuit 190 is employed.

The slave chip 100B, on the other hand, receives only the positive PWM signal PWMP from the master chip 100A. This signal is transmitted via the pin PWMNU of the master chip 100A and the pin PWMID of the slave chip 100B. Once received, the positive PWM signal PWMP is input to the multiplexers 130B and 140B within the slave chip 100B. Similar to the master chip 100A, the power stage 150B in the slave chip 100B receives the MUX signals SM1*s* and SM2*s* from the multiplexers 130B and 140B and uses them to generate a positive output signal SOPs and a negative output signal SONs. These output signals are also used to drive the speaker 180. The LC circuit 195, identical in function to the LC circuit 190 coupled to the master chip 100A, is used to smooth the output waveforms of the positive output signal SOPs and the negative output signal SONs and remove any switching noise.

Figure 6:
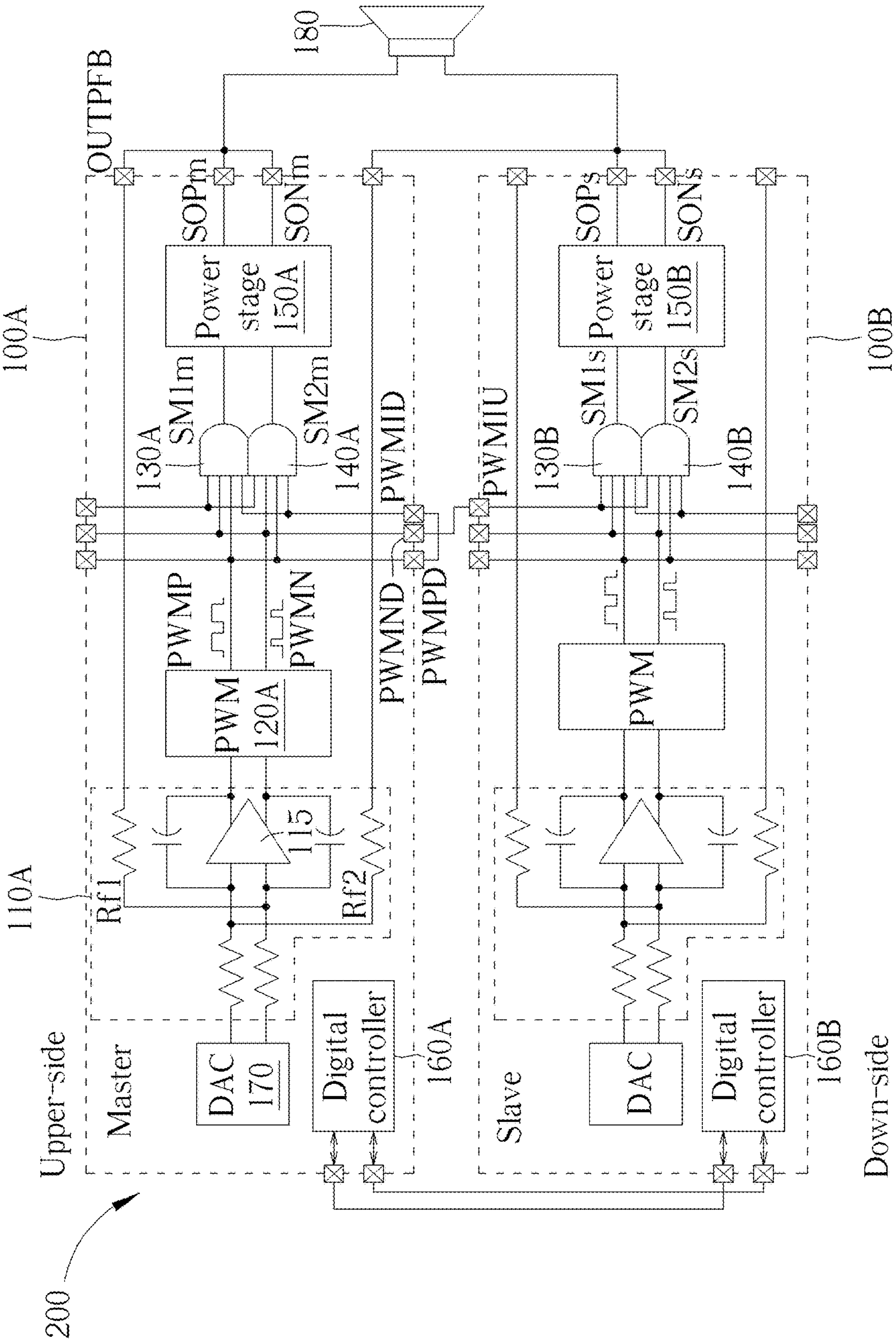
FIG. 6 depicts an amplifier with a PTBL configuration according to another embodiment.

FIG. 6 depicts an amplifier 600 with a PTBL configuration according to an embodiment. Similar to the amplifier 200, the amplifier 600 comprises two substantially identical chips, a master chip 100A and a slave chip 100B, both of which contain the class-D amplifier 100. The master chip 100A is positioned on the upper-side of the slave chip 100B, and they are interconnected to form the PBTL configuration.

In this embodiment, however, a speaker 180 is coupled directly to the positive and negative output terminals of the power stage 150A within the master chip 100A. The speaker 180 is also coupled to the feedback resistors Rf1 and Rf2 of the loop filter 110A (via OUTPFB and OUTNFB) in the master chip 100A.

To facilitate digital signal and timing synchronization between the master and slave chips, the digital controller 160A of the master chip 100A and the digital controller 160B of the slave chip 100B are interconnected via pins D2D_CLK and D2D_DATA.

In the PBTL configuration described in this embodiment, the master chip 100A is responsible for generating both a positive PWM signal PWMP and a negative PWM signal PWMN with the PWM generator 120A. The positive PWM signal PWMP is routed through the pins PWMPD and PWMID to the multiplexers 130A and 140A within the master chip. These multiplexers 130A and 140A output the MUX signals SM1*m* and SM2*m*, which are then fed into the power stage 150A. The power stage 150A utilizes these signals to generate a positive output signal SOPm and a negative output signal SONm, which are used to drive the speaker 180.

The slave chip 100B, on the other hand, receives only the negative PWM signal PWMN from the master chip 100A. This signal is transmitted via the pin PWMND of the master chip 100A and the pin PWMIU of the slave chip 100B. Once received, the negative PWM signal PWMN is input to the multiplexers 130B and 140B within the slave chip 100B. Similar to the master chip 100A, the power stage 150B in the slave chip 100B receives the MUX signals SM1*s* and SM2*s* from the multiplexers 130B, 140B and uses them to generate a positive output signal SOPs and a negative output signal SONs. These output signals are also used to drive the speaker 180.

The master chip and slave chip can be configured in arrangements comparable to those outlined in previous embodiments (e.g., amplifiers 200, 300, 400, and 500). These configurations may include various spatial orientations and interconnections designed to optimize signal processing, power efficiency, and thermal management. The specific placement and relationship between the master and slave chips depends on the desired implementation. However, as the fundamental principles governing these arrangements have been extensively discussed in the aforementioned embodiments, these specifications will not be repeated here for the sake of brevity.

Figure 7:
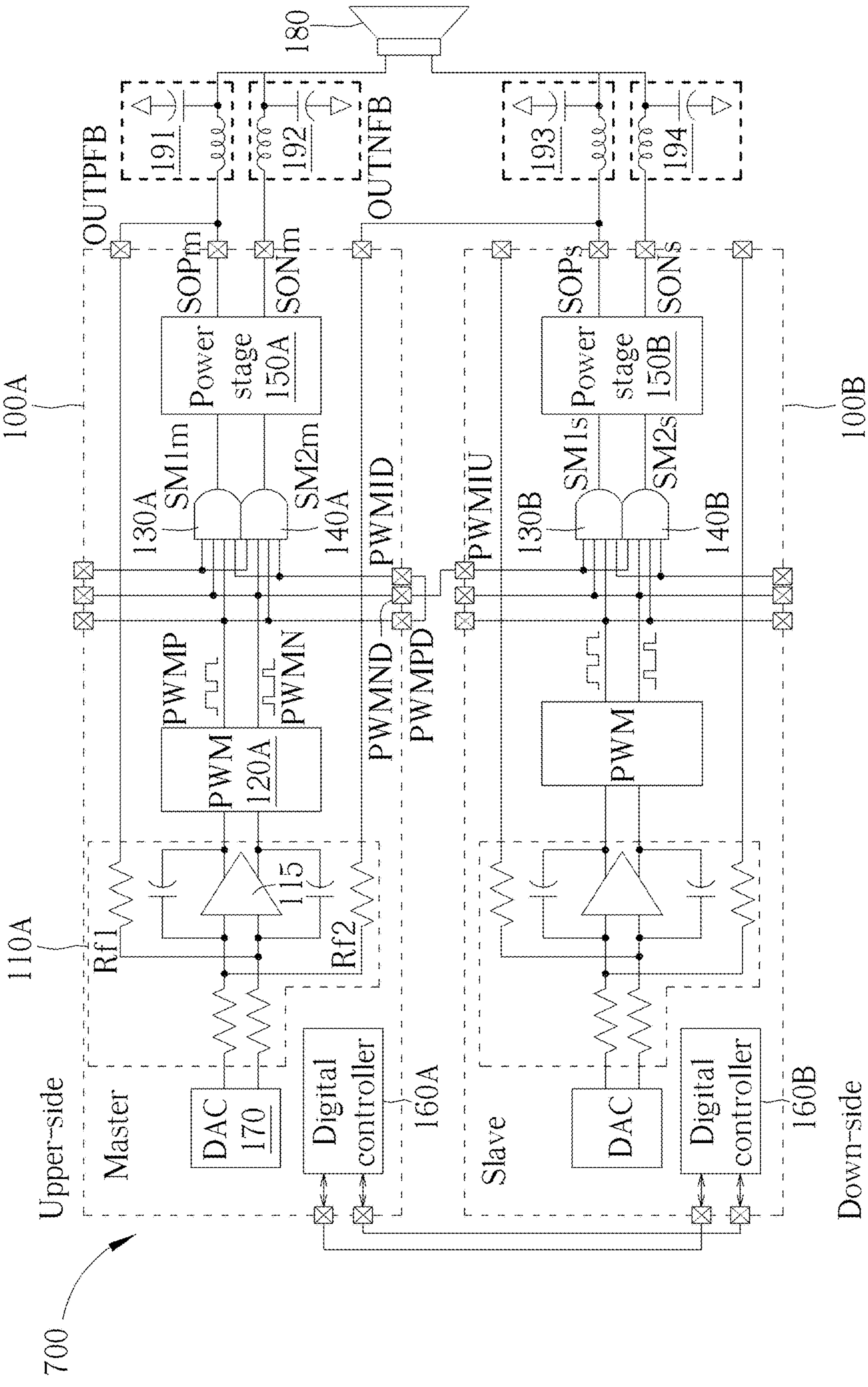
FIG. 7 depicts an amplifier with a PTBL configuration according to another embodiment.

FIG. 7 depicts an amplifier 700 with a PTBL configuration according to an embodiment. Similar to the amplifier 200, the amplifier 700 comprises two substantially identical chips, a master chip 100A and a slave chip 100B, both of which contain the class-D amplifier 100. The master chip 100A is positioned on the upper-side of the slave chip 100B, and they are interconnected to form the PBTL configuration.

In this embodiment, however, a speaker 180 is coupled four LC circuits 191, 192, 193 and 194. The LC circuit 191 is coupled between the speaker 180 and the positive output terminal of the power stage 150A the master chip 100A. The LC circuit 192 is coupled between the speaker 180 and the negative output terminal of the power stage 150A of the master chip 100A. The LC circuit 193 is coupled between the speaker 180 and the positive output terminal of the power stage 150B of the slave chip 100B. The LC circuit 194 coupled between the speaker 180 and the negative output terminal of the power stage 150B of the slave chip 100B. The loop filter 110A, more specifically, the feedback resistor Rf1 can be coupled to the LC circuit 191. Also, the loop filter 110A, more specifically, the feedback resistor Rf2 can be coupled to the LC circuit 193.

In certain embodiments, the loop filter 110A can be coupled to the LC circuit 192 and the LC circuit 193. In certain embodiments, the loop filter 110A can be coupled to the LC circuit 191 and the LC circuit 194. In certain embodiments, the loop filter 110A can be coupled to the LC circuit 192 and the LC circuit 194. These different arrangements allow for flexibility in the circuit design and potentially optimize performance under different conditions.

To facilitate digital signal and timing synchronization between the master and slave chips, the digital controller 160A of the master chip 100A and the digital controller 160B of the slave chip 100B are interconnected via pins D2D_CLK and D2D_DATA.

In the PBTL configuration described in this embodiment, the master chip 100A is responsible for generating both a positive PWM signal PWMP and a negative PWM signal PWMN with the PWM generator 120A. The positive PWM signal PWMP is routed through the pins PWMPD and PWMID to the multiplexers 130A and 140A within the master chip. These multiplexers 130A and 140A output the MUX signals SM1*m* and SM2*m*, which are then fed into the power stage 150A. The power stage 150A utilizes these signals to generate a positive output signal SOPm and a negative output signal SONm, which are used to drive the speaker 180. To remove switching noise and smooth the output waveforms of the positive output signal SOPm and the negative output signal SONm, the LC circuits 191 and 192 is employed.

The slave chip 100B, on the other hand, receives only the negative PWM signal PWMN from the master chip 100A. This signal is transmitted via the pin PWMND of the master chip 100A and the pin PWMIU of the slave chip 100B. Once received, the negative PWM signal PWMN is input to the multiplexers 130B and 140B within the slave chip 100B. Similar to the master chip 100A, the power stage 150B in the slave chip 100B receives the MUX signals SM1*s* and SM2*s* from the multiplexers 130B, 140B and uses them to generate a positive output signal SOPs and a negative output signal SONs. These output signals are also used to drive the speaker 180. The LC circuits 193 and 194, identical in function to the LC circuits 191 and 192 coupled to the master chip 100A, is used to smooth the output waveforms of the positive output signal SOPs and the negative output signal SONs and remove any switching noise.

The master chip and slave chip can be configured in arrangements comparable to those outlined in previous embodiments (e.g., amplifiers 200, 300, 400, and 500). These configurations may include various spatial orientations and interconnections designed to optimize signal processing, power efficiency, and thermal management. The specific placement and relationship between the master and slave chips depends on the desired implementation. However, as the fundamental principles governing these arrangements have been extensively discussed in the aforementioned embodiments, these specifications will not be repeated here for the sake of brevity.

The disclosed PBTL configuration for class-D amplifiers offers several significant advantages. One of the primary benefits is the increased design flexibility it provides. The modular architecture allows a single chip to operate independently for lower power applications, while two substantially identical chips can be combined to form a PBTL configuration when higher output power is required. This scalability enables designers to adapt the amplifier to various power needs without extensive redesign, saving time and resources.

Another advantage of this invention is the reduced circuit complexity in single-chip configurations. By eliminating the need for additional circuitry to support parallel operation, the design is simplified, potentially leading to lower manufacturing costs and improved reliability. This streamlined approach makes the amplifier more accessible and cost-effective for a wide range of applications.

Moreover, the cross-chip PBTL configuration improves thermal management by distributing the power handling across multiple chips. This relaxes the thermal requirements for each individual chip package, allowing for more efficient heat dissipation. Consequently, the need for expensive heat sinks or other cooling solutions may be reduced, further optimizing the overall system design and cost.

The PBTL configuration also enhances power efficiency by enabling the amplifier to drive higher power loads with reduced effective output impedance. This improvement in power efficiency contributes to better overall system performance, making the amplifier suitable for demanding audio applications.

In summary, the disclosed amplifier architecture offers a versatile, efficient, and reliable solution for class-D amplifiers. Its modular design, reduced complexity, improved thermal management, enhanced power efficiency, and synchronization capabilities make it an attractive choice for a wide range of audio applications, from portable devices to high-power sound systems.

The terminology employed in the description of the various embodiments herein is intended for the purpose of describing particular embodiments and should not be construed as limiting. In the context of this description and the appended claims, the singular forms "a", "an", and "the" are intended to encompass plural forms as well, unless the context clearly indicates otherwise.

It should be understood that the term "and/or" as used herein is intended to encompass any and all possible combinations of one or more of the associated listed items. Furthermore, it should be noted that the terms "includes," "including," "comprises," and/or "comprising," when used in this specification, indicate the presence of stated features, integers, steps, operations, elements, and/or components, but do not exclude the presence or addition of one or more other features, integers, steps, operations, elements, components, and/or groups thereof.

In the context of this disclosure, the terms "coupled," "connected," "connecting," "electrically connected," and similar expressions are used interchangeably to broadly denote the state of being electrically or electronically connected. Furthermore, an entity is deemed to be in "communication" with another entity (or entities) when it electrically transmits and/or receives information signals to/from the other entity, irrespective of whether these signals contain voice information or non-voice data/control information, and regardless of the signal type (analog or digital). It is important to note that this communication can occur through either wired or wireless means. The use of these terms is intended to encompass all forms of electrical or electronic connectivity relevant to the described embodiments.

The directional terms used in the embodiments such as up, down, left, right, upper-side, down-side, in front of or behind are just the directions referring to the attached figures. Thus, the direction terms used in the present disclosure are for illustration, and are not intended to limit the scope of the present disclosure. It should be noted that the elements which are specifically described or labeled may exist in various forms for those skilled in the art.

This interpretation of terminology is provided to ensure clarity and consistency throughout the specification and claims, and should not be construed as restricting the scope of the disclosed embodiments or the appended claims.

The various illustrative components, logic, logical blocks, modules, circuits, operations and algorithm processes described in connection with the embodiments disclosed herein may be implemented as electronic hardware, firmware, software, or combinations of hardware, firmware or software, including the structures disclosed in this specification and the structural equivalents thereof. The interchangeability of hardware, firmware and software has been described generally, in terms of functionality, and illustrated in the various illustrative components, blocks, modules, circuits and processes described above. Whether such functionality is implemented in hardware, firmware or software depends upon the particular application and design constraints imposed on the overall system.

The hardware and data processing apparatus utilized to implement the various illustrative components, logics, logical blocks, modules, and circuits described herein may comprise, without limitation, one or more of the following: a general-purpose single-chip or multi-chip processor, a digital signal processor (DSP), an application specific integrated circuit (ASIC), a field programmable gate array (FPGA), other programmable logic devices (PLDs), discrete gate or transistor logic, discrete hardware components, or any suitable combination thereof. Such hardware and apparatus shall be configured to perform the functions described herein.

A general-purpose processor may include, but is not limited to, a microprocessor, or alternatively, any conventional processor, controller, microcontroller, or state machine. In certain implementations, a processor may be realized as a combination of computing devices. Such combinations may include, for example, a DSP and a microprocessor, a plurality of microprocessors, one or more microprocessors in conjunction with a DSP core, or any other such configuration as may be suitable for the intended application.

It is to be understood that in some embodiments, particular processes, operations, or methods may be executed by circuitry specifically designed for a given function. Such function-specific circuitry may be optimized to enhance performance, efficiency, or other relevant metrics for the particular task at hand. The selection of specific hardware implementation shall be determined based on the particular requirements of the application, which may include, inter alia, performance specifications, power consumption constraints, cost considerations, and size limitations.

In certain aspects, the subject matter described herein may be implemented as software. Specifically, various functions of the disclosed components, or steps of the methods, operations, processes, or algorithms described herein, may be realized as one or more modules within one or more computer programs. These computer programs may comprise non-transitory processor-executable or computer-executable instructions, encoded on one or more tangible processor-readable or computer-readable storage media. Such instructions are configured for execution by, or to control the operation of, data processing apparatus, including the components of the devices described herein. The aforementioned storage media may include, but are not limited to, RAM, ROM, EEPROM, CD-ROM or other optical disk storage, magnetic disk storage or other magnetic storage devices, or any other medium capable of storing program code in the form of instructions or data structures.

It should be understood that combinations of the above-mentioned storage media are also contemplated within the scope of computer-readable storage media for the purposes of this disclosure.

Various modifications to the embodiments described in this disclosure may be readily apparent to persons having ordinary skill in the art, and the generic principles defined herein may be applied to other embodiments without departing from the spirit or scope of this disclosure. Thus, the claims are not intended to be limited to the embodiments shown herein, but are to be accorded the widest scope consistent with this disclosure, the principles and the novel features disclosed herein.

In certain implementations, the embodiments may comprise the disclosed features and may optionally include additional features not explicitly described herein. Conversely, alternative implementations may be characterized by the substantial or complete absence of non-disclosed elements. For the avoidance of doubt, it should be understood that in some embodiments, non-disclosed elements may be intentionally omitted, either partially or entirely, without departing from the scope of the invention. Such omissions of non-disclosed elements shall not be construed as limiting the breadth of the claimed subject matter, provided that the explicitly disclosed features are present in the embodiment.

Additionally, various features that are described in this specification in the context of separate embodiments also can be implemented in combination in a single implementation. Conversely, various features that are described in the context of a single implementation also can be implemented in multiple embodiments separately or in any suitable subcombination. As such, although features may be described above as acting in particular combinations, and even initially claimed as such, one or more features from a claimed combination can in some cases be excised from the combination, and the claimed combination may be directed to a subcombination or variation of a subcombination.

The depiction of operations in a particular sequence in the drawings should not be construed as a requirement for strict adherence to that order in practice, nor should it imply that all illustrated operations must be performed to achieve the desired results. The schematic flow diagrams may represent example processes, but it should be understood that additional, unillustrated operations may be incorporated at various points within the depicted sequence. Such additional operations may occur before, after, simultaneously with, or between any of the illustrated operations.

Additionally, it should be understood that the various figures and component diagrams presented and discussed within this document are provided for illustrative purposes only and are not drawn to scale. These visual representations are intended to facilitate understanding of the described embodiments and should not be construed as precise technical drawings or limiting the scope of the invention to the specific arrangements depicted.

In certain implementations, multitasking and parallel processing may prove advantageous. Furthermore, while various system components are described as separate entities in some embodiments, this separation should not be interpreted as mandatory for all embodiments. It is contemplated that the described program components and systems may be integrated into a single software package or distributed across multiple software packages, as dictated by the specific implementation requirements.

It should be noted that other embodiments, beyond those explicitly described, fall within the scope of the appended claims. The actions specified in the claims may, in some instances, be performed in an order different from that in which they are presented, while still achieving the desired outcomes. This flexibility in execution order is an inherent aspect of the claimed processes and should be considered within the scope of the invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A class-D amplifier comprising:

a loop filter (LPF) configured to generate a positive LPF signal and a negative LPF signal according to a first analog signal, a second analog signal, a first feedback signal and a second feedback signal;

a pulse-width modulation (PWM) generator coupled to the loop filter, configured to generate a first positive PWM signal and a first negative PWM signal according to the positive LPF signal and the negative LPF signal respectively;

a first multiplexer (MUX) coupled to the PWM generator, configured to output a first MUX signal selected from a signal group comprising the first positive PWM signal and/or the first negative PWM signal;

a second multiplexer coupled to the PWM generator, configured to output a second MUX signal selected from the signal group; and a power stage coupled to the first multiplexer and the second multiplexer, configured to generate a positive output signal to a positive output terminal according to the first MUX signal, and a negative output signal to a negative output terminal according to the second MUX signal.

2. The class-D amplifier of claim 1, wherein:

the signal group further comprises a second positive PWM signal and/or a second negative PWM signal.

3. The class-D amplifier of claim 2, wherein:

the signal group further comprises a third positive PWM signal and/or a third negative PWM signal.

4. The class-D amplifier of claim 1, further comprising a digital-to-analog converter (DAC) coupled to the loop filter, configured to convert digital input signals to the first analog signal and the second analog signal.

5. The class-D amplifier of claim 4, further comprising a digital controller for timing synchronization and processing the digital input signals.

6. The class-D amplifier of claim 1, wherein the loop filter comprises an integrator configured to receive and process the first analog signal, the second analog signal, the first feedback signal and the second feedback signal.

7. The class-D amplifier of claim 6, wherein the integrator comprises:

a fully-differential amplifier comprising:

a negative input terminal configured to receive the first analog signal;

a positive input terminal configured to receive the second analog signal;

a positive output terminal coupled to the PWM generator, configured to output the positive LPF signal; and a negative output terminal coupled to the PWM generator, configured to output the negative LPF signal;

a first resistor coupled to the negative input terminal of the fully-differential amplifier;

a second resistor coupled to the positive input terminal of the fully-differential amplifier;

a first feedback resistor coupled to the positive input terminal of the fully-differential amplifier; and a second feedback resistor coupled to the negative input terminal of the fully-differential amplifier.

8. An amplifier, comprising:

a master chip comprising, a loop filter (LPF) configured to generate a positive LPF signal and a negative LPF signal according to a first analog signal, a second analog signal, a first feedback signal and a second feedback signal;

a pulse-width modulation (PWM) generator coupled to the loop filter, configured to generate a positive PWM signal and a negative PWM signal according to the positive LPF signal and the negative LPF signal respectively;

a first multiplexer (MUX) coupled to the PWM generator, configured to output a first MUX signal selected from a signal group comprising the positive PWM signal and the negative PWM signal;

a second multiplexer coupled to the PWM generator, configured to output a second MUX signal selected from the signal group; and a power stage coupled to the first multiplexer and the second multiplexer, configured to generate a positive output signal to a positive output terminal according to the first MUX signal, and a negative output signal to a negative output terminal according to the second MUX signal; and a slave chip comprising:

a loop filter (LPF);

a pulse-width modulation (PWM) generator coupled to the loop filter;

a first multiplexer (MUX) coupled to the PWM generator of the master chip and the PWM generator of the slave chip, configured to output a first MUX signal selected from the signal group;

a second multiplexer coupled to the PWM generators of the master chip and the slave chip, configured to output a second MUX signal selected from the signal group; and a power stage coupled to the first multiplexer and the second multiplexer of the slave chip, configured to generate a positive output signal to a positive output terminal according to the first MUX signal output by the first MUX of the slave chip, and a negative output signal to a negative output terminal according to the second MUX signal output by the second MUX of the slave chip;

wherein the master chip and the slave chip form a parallel bridge-tied load (PBTL) configuration.

9. The amplifier of claim 8, wherein the loop filter comprises an integrator configured to receive and process the first analog signal, the second analog signal, the first feedback signal and the second feedback signal.

10. The amplifier of claim 9, wherein the integrator of the master chip comprises:

a fully-differential amplifier comprising:

a negative input terminal configured to receive the first analog signal;

a positive input terminal configured to receive the second analog signal;

a positive output terminal coupled to the PWM generator, configured to output the positive LPF signal; and a negative output terminal coupled to the PWM generator, configured to output the negative LPF signal;

a first resistor coupled to the negative input terminal of the fully-differential amplifier;

a second resistor coupled to the positive input terminal of the fully-differential amplifier;

a first feedback resistor coupled to the positive input terminal of the fully-differential amplifier; and a second feedback resistor coupled to the negative input terminal of the fully-differential amplifier.

11. The amplifier of claim 8, further comprising:

a speaker coupled to the positive output terminal and the negative output terminal of the power stage of the master chip, and the loop filter of the master chip.

12. The amplifier of claim 8, further comprising:

a speaker;

a first inductor-capacitor (LC) circuit coupled to the speaker, the positive output terminal and the negative output terminal of the power stage the master chip, and the loop filter of the master chip; and a second LC circuit coupled to the speaker, the positive output terminal and the negative output terminal of the power stage of the slave chip, and the loop filter of the master chip.

13. The amplifier of claim 8, further comprising:

a speaker;

a first inductor-capacitor (LC) circuit coupled between the speaker and the positive output terminal of the power stage the master chip;

a second LC circuit coupled between the speaker and the negative output terminal of the power stage of the master chip;

a third LC circuit coupled between the speaker and the positive output terminal of the power stage of the slave chip; and a fourth LC circuit coupled between the speaker and the negative output terminal of the power stage of the slave chip.

14. The amplifier of claim 13, wherein:

the loop filter of the master chip is coupled to the first LC circuit or the second LC circuit; and the loop filter of the slave chip is coupled to the third LC circuit or the fourth LC circuit.

15. The amplifier of claim 8, wherein the slave chip receives the signal group from the master chip.

16. The amplifier of claim 8, wherein the master chip and the slave chip each comprises a digital controller for processing digital input signals.

17. The amplifier of claim 8, wherein the digital controller of the master chip and the digital controller of the slave chip are coupled together.

18. The amplifier of claim 17, wherein the digital controller of the master chip and the digital controller of the slave chip synchronize timing and state of the master chip and the slave chip.

19. The amplifier of claim 8, wherein the master chip further comprises a digital-to-analog converter coupled to the loop filter of the master chip, configured to convert digital input signals to the first analog signal and the second analog signal.

20. The amplifier of claim 8, wherein the master chip and the slave chip have identical circuit structures.

* * * * *